(12) United States Patent
Nam

(10) Patent No.: US 12,051,687 B2
(45) Date of Patent: Jul. 30, 2024

(54) ELECTROSTATIC DISCHARGE PROTECTION DEVICE WITH SILICON CONTROLLED RECTIFIER PROTECTION CIRCUIT

(71) Applicant: SK keyfoundry Inc., Cheongju-si (KR)

(72) Inventor: Jong Ho Nam, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 21 days.

(21) Appl. No.: 17/526,219

(22) Filed: Nov. 15, 2021

(65) Prior Publication Data
US 2022/0352144 A1    Nov. 3, 2022

(30) Foreign Application Priority Data
Apr. 28, 2021   (KR) .................. 10-2021-0054864

(51) Int. Cl.
*H01L 27/02*      (2006.01)
*H01L 29/74*      (2006.01)

(52) U.S. Cl.
CPC ...... *H01L 27/0248* (2013.01); *H01L 29/7436* (2013.01)

(58) Field of Classification Search
CPC .......... H01L 27/0248; H01L 29/7436; H01L 27/0262; H01L 29/0603; H01L 29/0642; H01L 29/0692; H01L 29/456; H01L 29/87
USPC ....................................................... 257/173
See application file for complete search history.

(56) References Cited

U.S. PATENT DOCUMENTS

| | | | |
|---|---|---|---|
| 4,646,425 A * | 3/1987 | Owens | H10B 41/40 257/E27.081 |
| 5,872,379 A | 2/1999 | Lee | |
| 5,962,876 A | 10/1999 | Yu | |
| 6,140,694 A * | 10/2000 | Chen | H01L 27/0237 257/574 |
| 6,147,369 A | 11/2000 | Chen et al. | |
| 6,281,527 B1 * | 8/2001 | Chen | H01L 27/0266 257/168 |
| 6,538,266 B2 | 3/2003 | Lee et al. | |
| 6,720,623 B2 | 4/2004 | Chen | |
| 7,859,009 B1 * | 12/2010 | Kerr | H01L 29/868 257/107 |
| 8,610,251 B1 * | 12/2013 | Salcedo | H01L 29/747 257/355 |
| 8,680,620 B2 * | 3/2014 | Salcedo | H01L 27/0921 257/362 |
| 9,647,069 B2 * | 5/2017 | Shrivastava | H01L 29/0878 |
| 9,799,641 B2 | 10/2017 | Ko et al. | |
| 2001/0019138 A1 | 9/2001 | Czech et al. | |

(Continued)

*Primary Examiner* — Kimberly N Rizkallah
*Assistant Examiner* — Pratiksha Jayant Lohakare
(74) *Attorney, Agent, or Firm* — NSIP Law

(57) ABSTRACT

An electrostatic discharge (ESD) protection device, incudes an N-type well and a P-type well formed in a semiconductor substrate; a first N-type diffusion region and a first P-type diffusion region formed in the N-type well, separated by a first separation film, and each connected to an Anode terminal; a second N-type diffusion region and a second P-type diffusion region formed in the P-type well, separated by a second separation film, and each connected to a Cathode terminal; a P-type floating region, formed in the P-type well, spaced apart from the second N-type diffusion region and the second P-type diffusion region; and a non-sal layer covering the P-type floating region.

6 Claims, 10 Drawing Sheets

(56) References Cited

U.S. PATENT DOCUMENTS

| | | | |
|---|---|---|---|
| 2002/0079538 A1 | 6/2002 | Su et al. | |
| 2003/0042529 A1* | 3/2003 | Hashimoto | H01L 29/7883 257/315 |
| 2005/0230761 A1* | 10/2005 | Imahashi | H01L 27/0262 257/370 |
| 2005/0253217 A1* | 11/2005 | Pan | H01L 27/0623 257/E29.268 |
| 2006/0258067 A1* | 11/2006 | Jeon | H01L 29/87 438/154 |
| 2007/0075366 A1* | 4/2007 | Hamamoto | H01L 29/78612 257/E27.084 |
| 2008/0237783 A1* | 10/2008 | Williams | H01L 29/1083 257/E29.174 |
| 2008/0308855 A1* | 12/2008 | El-Kareh | H10B 41/35 257/E21.409 |
| 2012/0080716 A1* | 4/2012 | Ker | H01L 23/62 257/107 |
| 2016/0093629 A1* | 3/2016 | Wang | H01L 29/0646 438/257 |
| 2017/0062406 A1* | 3/2017 | Ko | H01L 29/0649 |

* cited by examiner

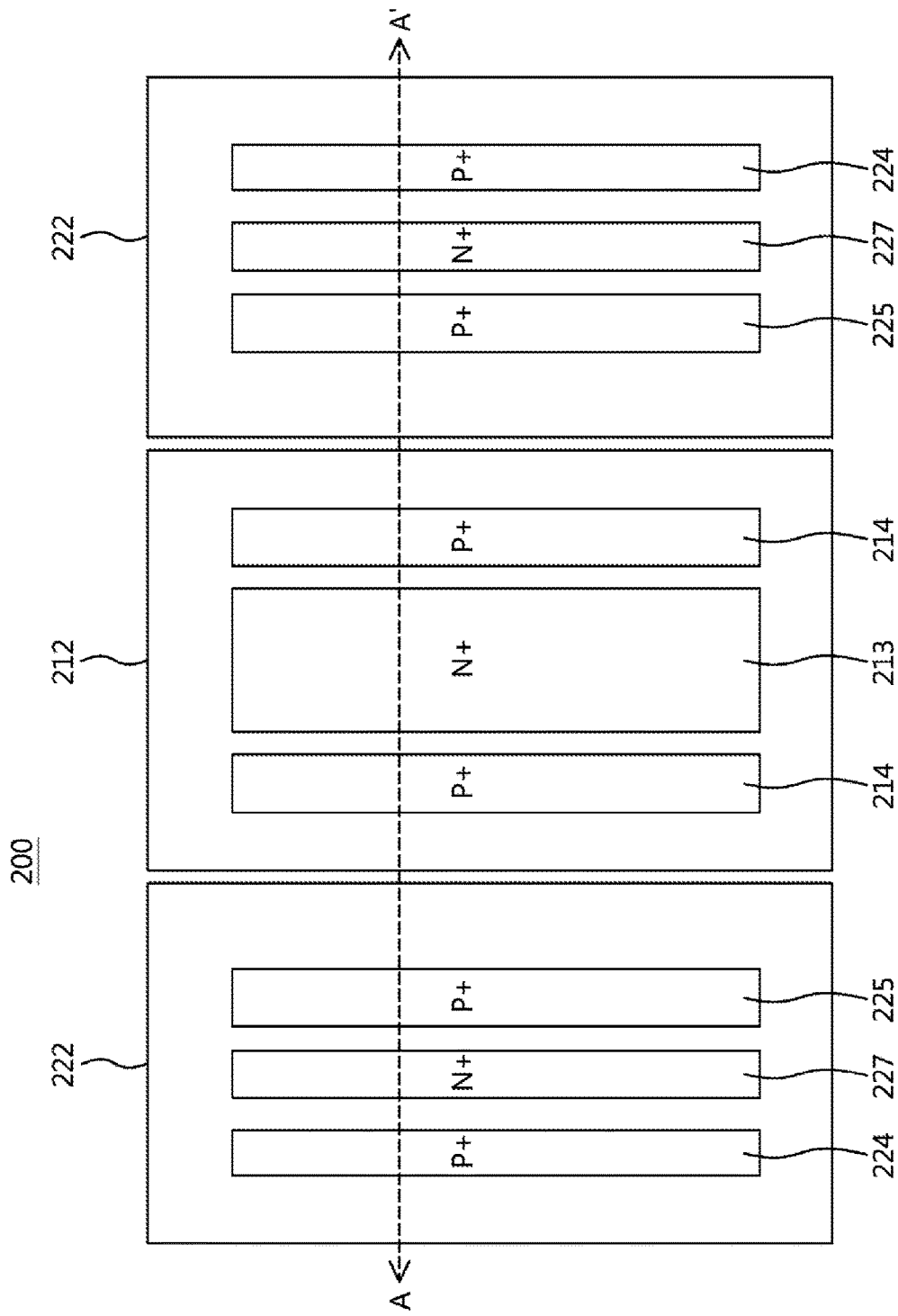

ELECTROSTATIC DISCHARGE PROTECTION DEVICE WITH SILICON CONTROLLED RECTIFIER PROTECTION CIRCUIT

CROSS-REFERENCE TO RELATED APPLICATION

This application claims the benefit under 35 U.S.C. § 119 to Korean Patent Application No. 10-2021-0054864 filed on Apr. 28, 2021, in the Korean Intellectual Property Office, the entire disclosure of which is incorporated herein by reference for all purposes.

BACKGROUND

1. Field

The following description related to an electrostatic discharge protection device with silicon controlled rectifier.

2. Description of Related Art

As the size of semiconductor devices is becoming smaller and components per chip are becoming denser, the importance of ESD protection device, which is to protect the inner circuit of a chip from Electro Static Discharge (ESD), is getting higher.

Diodes, resistors, transistors, etc., are mainly used as a protection device in a protection circuit, and thyristor or silicon controlled rectifier (SCR) may also be used.

As a typical non-sal layer oxide of a MOSFET (Metal-Oxide-Semiconductor Field Effects Transistor) is becoming thinner and weaker, a protection device is needed to protect the non-sal layer oxide from external factors such as ESD that may exist in an input buffer of an input/output circuit.

Damage of an inner circuit such as an input buffer occurs because of junction spiking or oxide rupture, etc., caused by Joule heat generated by stress current caused by ESD being input through an input pad and discharges to another device throughout the inner circuit.

To solve this problem, before the stress current caused by ESD evades throughout an inner circuit, an ESD protect circuit is inserted to immediately discharge the electric charge injected in an input terminal toward a power supply terminal to prevent damage to the semiconductor terminal by ESD. Accordingly, thyristor or Silicon controlled rectifier (SCR) may be used for ESD protection.

However, parasitic transistors have high voltage to cause a breakdown. Accordingly, a trigger voltage of SCR 100 is very high more than 20V, and a holding voltage is low. So, it is hard to apply to an actual product because of the possibility of a Latch-up.

Moreover, when electricity lower than a trigger voltage of SCR is applied, an inner circuit is highly likely to be damaged.

Also, it is hard to use it as a protection device between power terminals because there is always a possibility of a Latch-up, as a holding voltage becomes lower than an actual operating voltage because of a low impedance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electrostatic discharge (ESD) protection device, incudes an N-type well and a P-type well formed in a semiconductor substrate; a first N-type diffusion region and a first P-type diffusion region formed in the N-type well, separated by a first separation film, and each connected to an Anode terminal; a second N-type diffusion region and a second P-type diffusion region formed in the P-type well, separated by a second separation film, and each connected to a Cathode terminal; a P-type floating region, formed in the P-type well, spaced apart from the second N-type diffusion region and the second P-type diffusion region; and a non-sal layer covering the P-type floating region.

A width of the first N-type diffusion region may be formed wider than a width of the second N-type diffusion region.

The first P-type diffusion region may be formed on opposite sides of the first N-type diffusion region.

The ESD protection device may further include a silicide film formed on the first N-type diffusion region. The non-sal layer may be formed on the first N-type diffusion region.

The first N-type diffusion region, the first P-type diffusion region, the second N-type diffusion region, and the second P-type diffusion region may be each formed shallower than the first and the second separation films.

A width of the P-type floating region may be configured to control a holding voltage.

The ESD protection device may further include a deep P-type well in the substrate, an N-type drift region, overlapped with the N-type well, and a P-type body region, overlapped with the P-type well.

The ESD protection device may further include a resistor connected in the second P-type diffusion region. The resistor may be formed of poly-silicon.

The non-sal layer may cover portions of the first N-type diffusion region and the first P-type diffusion region.

The non-sal layer may cover a portion of the second N-type diffusion region.

In another general aspect, an ESD protection device includes a N-type well formed in a semiconductor substrate, a P-type well formed on opposite sides of the N-type well, a first N-type diffusion region formed in the N-type well, first P-type diffusion regions each formed on opposite sides of the first N-type diffusion region, a second N-type diffusion region and a second P-type diffusion region formed in the P-type well, and a floated P-type floating region formed in the P-type well. A width of the first N-type diffusion region is formed wider than a width of the second N-type region.

The width of the first N-type diffusion region may be formed wider than a width of the second P-type diffusion region.

The first N-type diffusion region and the first P-type diffusion region, connected with an Anode terminal, may be separated by a first separation film.

The second N-type diffusion region and the second P-type diffusion region, connected with a Cathode terminal, may be separated by a second separation film.

The ESD protection device may further include a deep P-type well in the substrate, and a N-type drift region and a P-type body region formed in the deep P-type well. The N-type well and the N-type drift region may overlap, and the P-type well and a P-type body region may overlap.

The ESD protection device may further include a resistor connected in the second P-type diffusion region. The resistor may be formed of poly-silicon.

In another general aspect, an electrostatic discharge (ESD) protection device, incudes an N-type well and a P-type well in a semiconductor substrate; a first N-type diffusion region and a first P-type diffusion region spaced apart in the N-type well, and each connected to an Anode terminal; a second N-type diffusion region and a second P-type diffusion region spaced apart in the P-type well, and each connected to a Cathode terminal; a P-type floating region in the P-type well, spaced apart from the second N-type diffusion region and the second P-type diffusion region; and a first non-sal layer disposed on the P-type floating region and a portion of the second N-type diffusion region, and a second non-sal layer disposed on portions of the first N-type diffusion region and the first P-type diffusion region.

A width of the first N-type diffusion region may be different from a width of the second N-type region.

The ESD protection device may further include a first separation film between the first N-type diffusion region and the first P-type diffusion region; and a second separation film between the second N-type diffusion region and the second P-type diffusion region.

The ESD protection device may further include an N-type drift region formed below the N-type well; and a P-type body region formed below the P-type well.

Other features and aspects will be apparent from the following detailed description, the drawings, and the claims.

BRIEF DESCRIPTION OF THE DRAWINGS

FIG. 2A and FIG. 2B are plan views of an ESD protection device based on a silicon controlled rectifier according to one or more embodiments of the disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
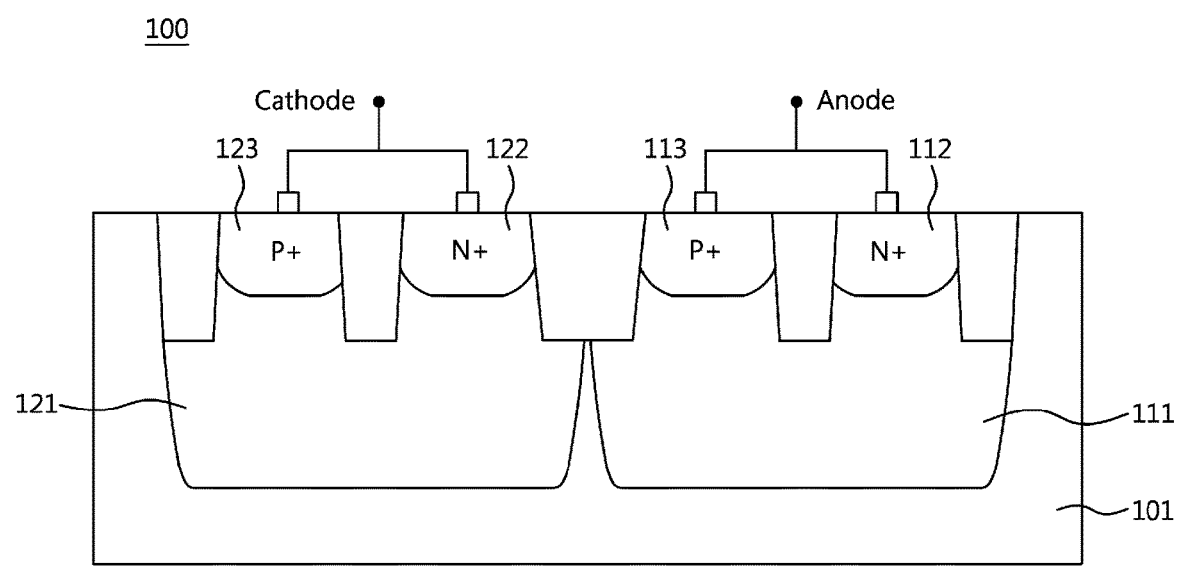
FIG. 1 is a cross-sectional view of SCR, one of the ESD devices, based on a normal silicon controlled rectifier.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

This disclosure solves the above problems, providing an ESD protection device based on a silicon controlling rectifier that is resistant to Latch-up by increasing a holding voltage.

Moreover, an ESD protection device based on a silicon controlling rectifier is provided to quickly turn on a diode by decreasing a trigger voltage.

A targeted problem of the disclosure is not limited by the problems mentioned above, and other problems may be understood by a person skilled in the relevant field of technology from the following description.

The detailed description about the disclosure is given below, according to attached drawings.

FIG. 1 is a cross-sectional view of SCR, one of the ESD devices based on a normal silicon controlled rectifier.

With reference to FIG. 1, SCR 100 has an N-type well 111 that includes an N-type diffusion region 112 and a P-type diffusion region 113 in a substrate 101, and a P-type well 121 that includes N-type diffusion region 122 and a P-type diffusion region 123 is formed.

Moreover, a terminal called Anode is connected with an N-type diffusion region (112, N-type) and a P-type diffusion region (113, P-type), which are included in N-type well 111. Another terminal called Cathode is connected with an N-type diffusion region (122, N-type) and a P-type diffusion region (123, P-type) included in P-type well 121.

A parasitic PNP transistor operates that is composed of an emitter, a collector, and a base. An N-type diffusion region 122 included in a P-type well 121, an N-type diffusion region 112 included in an N-type well, and a P-type well 121 are operated as a parasitic NPN transistor composed of an emitter, a collector, and a base and discharge an ESD current. There is an advantage that this SCR 100 may release a large current with a small area.

Figure 2B:
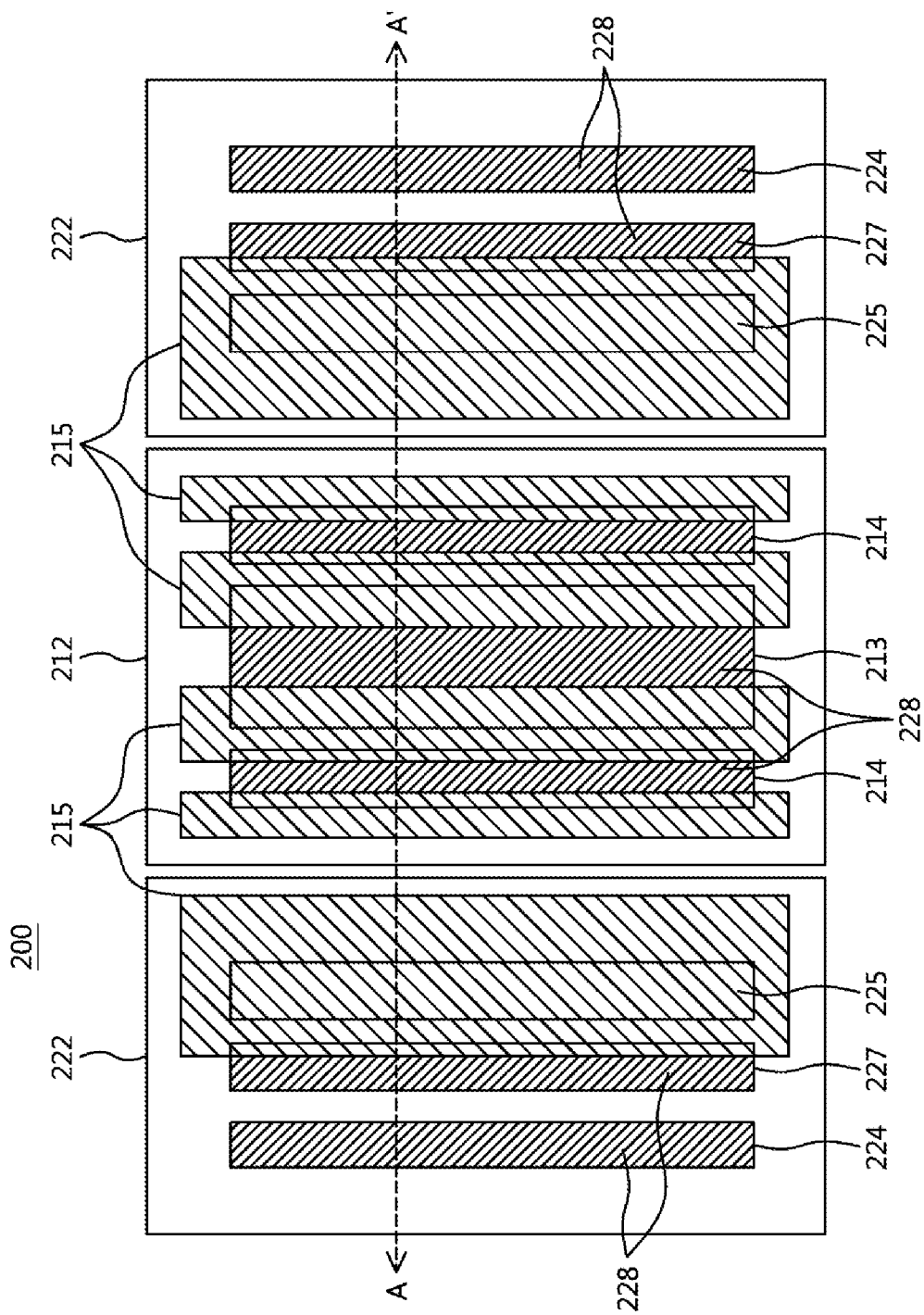

FIG. 2A and FIG. 2B are plan views of an ESD protection device based on a silicon controlled rectifier according to one or more embodiments of the disclosure.

With reference to FIG. 2, an ESD protection device 200, according to one or more embodiments of the disclosure, may include an N-type well 212 and two P-type wells 222 in a top view. A first N-type diffusion region 213 and two of first P-type diffusion regions 214 are formed in an N-type well 212. A P-type floating region 225, a second N-type diffusion region 227, a second P-type diffusion region 224 are formed in each of two P-type wells 222. The reason why an area or a width of a first N-type diffusion region 213 in an N-type well 212 is bigger than a width of two of first P-type diffusion regions 214, a P-type floating region 225, a second N-type diffusion 227, and a second P-type diffusion region 224 is to ensure the current capacity. Because an anode terminal shares a first N-type diffusion region 213, a current capacity of a first N-type diffusion region 213 is easily ensured. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

And two of the first P-type diffusion regions 214 are each placed on opposite sides of a first N-type diffusion region 213. An embodiment of FIG. 2A is two-finger type composition, which enables the operation of two SCRs (PNPN). Thus, two of first P-type diffusion regions 214 plays the role of an emitter of PNP of each SCR.

A P-type floating region 225 in two P-type wells 222 may be considered that it is doped without connecting with a terminal such as Anode, Cathode, etc. By controlling a width of P-type floating region 225, a base current may be controlled. The longer the width is, the more a base current increases, and because a current gain is diminished by increasing a base current, the holding voltage increases. Thus, an ESD protection device 200 may form a current path and discharge an ESD current inside a substrate through a positive feedback of a PNP and NPN transistor.

With reference to FIG. 2B, a non-sal layer 215 is formed on an N-type well 212. The non-sal layer 215 is a deposited insulating film to prevent the creation of silicide. It may be formed as an oxide, an oxide-nitride, or a nitride. A silicide film 228 is formed in areas that the non-sal layer 215 may not cover. A contact resistance may be diminished by forming a silicide film.

As shown in FIG. 2B, the non-sal layer 215 may cover a part of a first N-type diffusion region 213 and a part of two of first P-type diffusion regions 214. A silicide film 228 is formed in a remaining portion of the first N-type diffusion region 213 that the non-sal layer may not cover. Thus, a non-sal layer and a silicide film may be formed simultaneously on the first N-type diffusion region 213. Likewise, a silicide film 228 is formed in a remaining area of two of first P-type diffusion regions 214 that the non-sal layer 215 may not cover.

Also, a non-sal layer is formed on two P-type wells 222 too. The non-sal layer 215 may cover a part of a second N-type diffusion region 227. As an option, the non-sal layer 215 may cover a part of a second P-type diffusion region 224 (not shown). A silicide film 228 is formed in a rest area of a second N-type diffusion region 227 that a non-sal layer may not cover. Likewise, a silicide film 228 is formed on a rest area of a second P-type diffusion region 224 that the non-sal layer 215 may not cover.

And the non-sal layer 215 may cover a P-type floating region 225 completely. Thus, no contact plug is formed on the P-type floating region 225.

Figure 3:
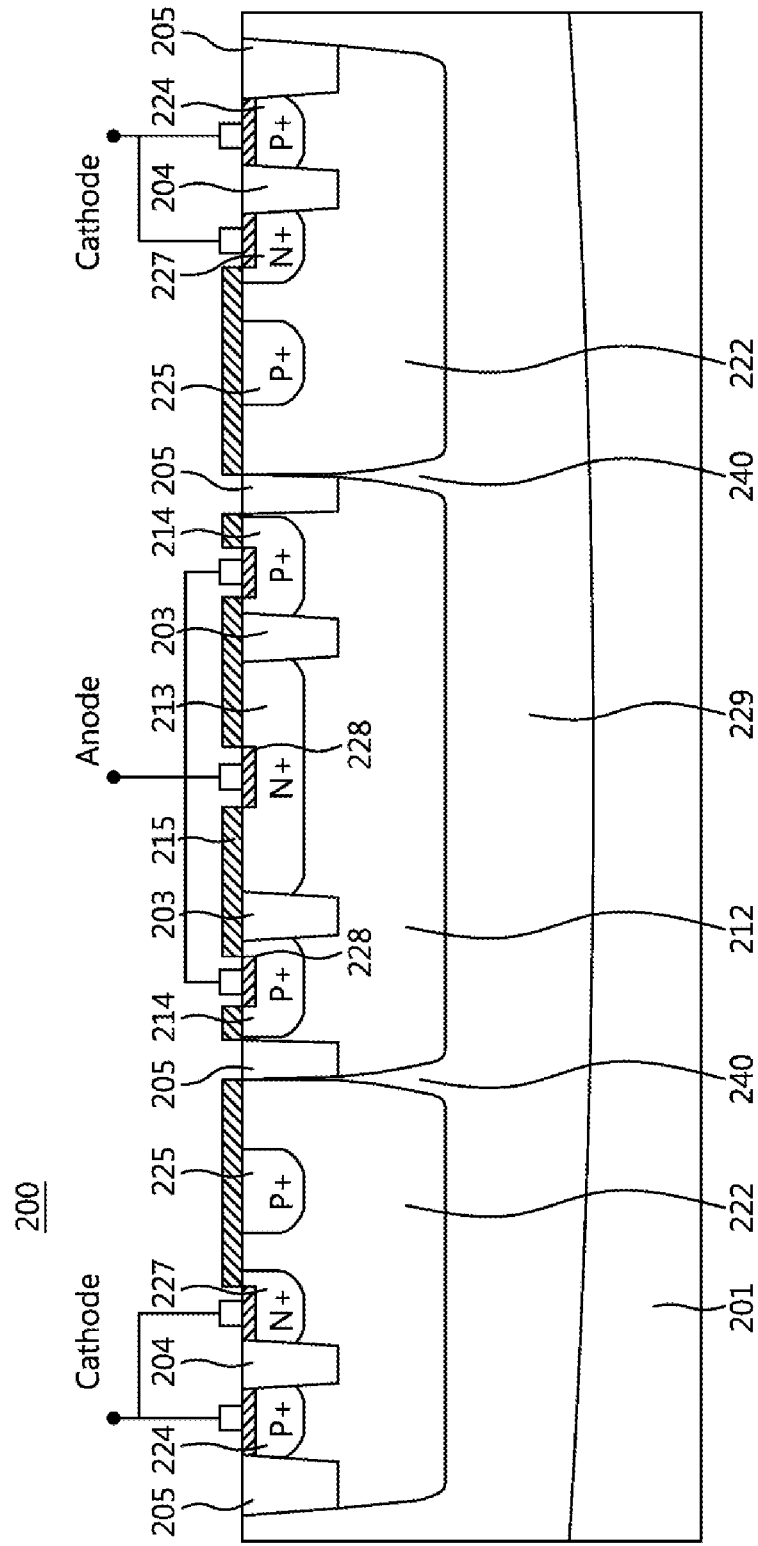
FIG. 3 is a cross-sectional view of A-A' of FIG. 2B, a section of an ESD protection device based on a silicon controlled rectifier according to one or more embodiments of the disclosure.

FIG. 3 is a cross-sectional view of A-A' of FIG. 2B, a section of an ESD protection device based on a silicon controlled rectifier, according to one or more embodiments of the disclosure.

With reference to FIG. 3, with an ESD protection device 200, according to one or more embodiments of the disclosure, an N-type well 212 and two P-type wells 222 are formed in a semiconductor substrate 201. An ESD protection device 200 may include a first N-type diffusion region 213 and two of first P-type diffusion regions 214 in the N-type well 212 that are separated by a first separation film 203. Each of the first N-type diffusion region 213 and two of first P-type diffusion regions 214 is connected to an Anode terminal. A second N-type diffusion region 227 and a second P-type diffusion region 224 in each of the two P-type well 222 are separated by a second separation film 204 and each connected to a Cathode terminal. Herein, a deep P-type well 229 doped as P-type may be formed in a semiconductor substrate 201.

The reason why a width or an area of a first N-type diffusion region 213 is bigger than that of two of first P-type diffusion regions 214, a second N-type diffusion region 227, and a second P-type diffusion region 224 is to ensure the current capacity, and for that, a first N-type diffusion region 213 may be enlarged. Because an anode terminal shares a first N-type diffusion region 213, a current capacity of a first N-type diffusion region 213 is easily ensured.

Each of the two P-type wells 222 may further include a P-type floating region 225 that is separately formed from a second N-type diffusion region 227 and a second P-type diffusion region 224. A P-type floating region 225 may be considered doped without connecting with a terminal such as Anode, Cathode, etc. A P-type floating region 225 is doped as a P-type with a higher concentration than each of the two P-type wells 222.

The P-type floating region 225 may increase a concentration of each of the two P-type well 222, which is a base of a parasitic PNP bipolar transistor.

Hence, a holding voltage increases as a current gain of a parasitic NPN bipolar transistor decreases. Also, as a holding voltage increases, resistance to Latch-up is reinforced.

The P-type floating region 225 may be located between the second N-type diffusion region 227 and the first P-type diffusion regions 214. Also, a length of a P-type floating region 225 may be controlled. Controlling a length of the P-type floating region 225 may be executed in a doping process using a mask.

A holding voltage may be controlled by adjusting a width of a P-type floating region 225. As explained, an ESD protection device 200 has a high holding voltage by a P-type floating region 225 formed in each of the two P-type wells 222. The P-type floating region 225 increases a hole's movement, increasing a base current of an NPN transistor. The increased base current decreases a current gain, making an ESD protection device 200 have a higher holding voltage.

An N-type well 212 and two P-type wells 222 may be separated by a third separation film 205 formed in the semiconductor substrate 201 or in a deep P-type well 229 formed in the semiconductor substrate 201. Herein, an N-type well 212 and two P-type wells 222 may have a separation space 240. Moreover, two P-type wells 222 may be doped with a higher concentration than a deep P-type well 229.

A trigger voltage may be controlled by adjusting a separation space 240 between an N-type well 212 and two P-type wells 222. For example, by diminishing the width of the separation space 240, it may be possible to increase a current gain and have a low trigger voltage. That is, a trigger voltage may be controlled, and the bigger the width of a separation space 240 between an N-type well 212 and P-type well 222 is, the higher a trigger voltage becomes.

The first N-type diffusion region 213 and the second N-type diffusion regions 227 may be doped with a higher concentration than the N-type well 212. Moreover, the first P-type diffusion regions 214 and the second P-type diffusion regions 224 formed may be doped with a higher concentration than the P-type well 222.

The first N-type diffusion region 213, the second N-type diffusion regions 227, the first P-type diffusion regions 214 and the second P-type diffusion regions 224 may be respectively formed in the N-type well 212 and the P-type wells 222 with a predetermined depth. Thus, for example, the first N-type diffusion region 213, the second N-type diffusion regions 227, the first P-type diffusion regions 214 and the second P-type diffusion regions 224 may be formed shallower than a first and a second separation 203, 204.

The non-sal layer 215 is formed on an N-type well 212. The non-sal layer 215 is a deposited insulating film to prevent the creation of a silicide. It may be formed as an oxide, an oxide-nitride, or a nitride. Thus, the non-sal layer 215 partially covers the first N-type diffusion region 213 and the two of first P-type diffusion regions 214.

Likewise, the non-sal layer 215 is formed on two P-type wells 222. The non-sal layer 215 partially covers a second N-type diffusion region 227. Also, the non-sal layer 215 fully covers a P-type floating region 225. Thus, no contact plug is connected to the P-type floating region 225.

Figure 4A:
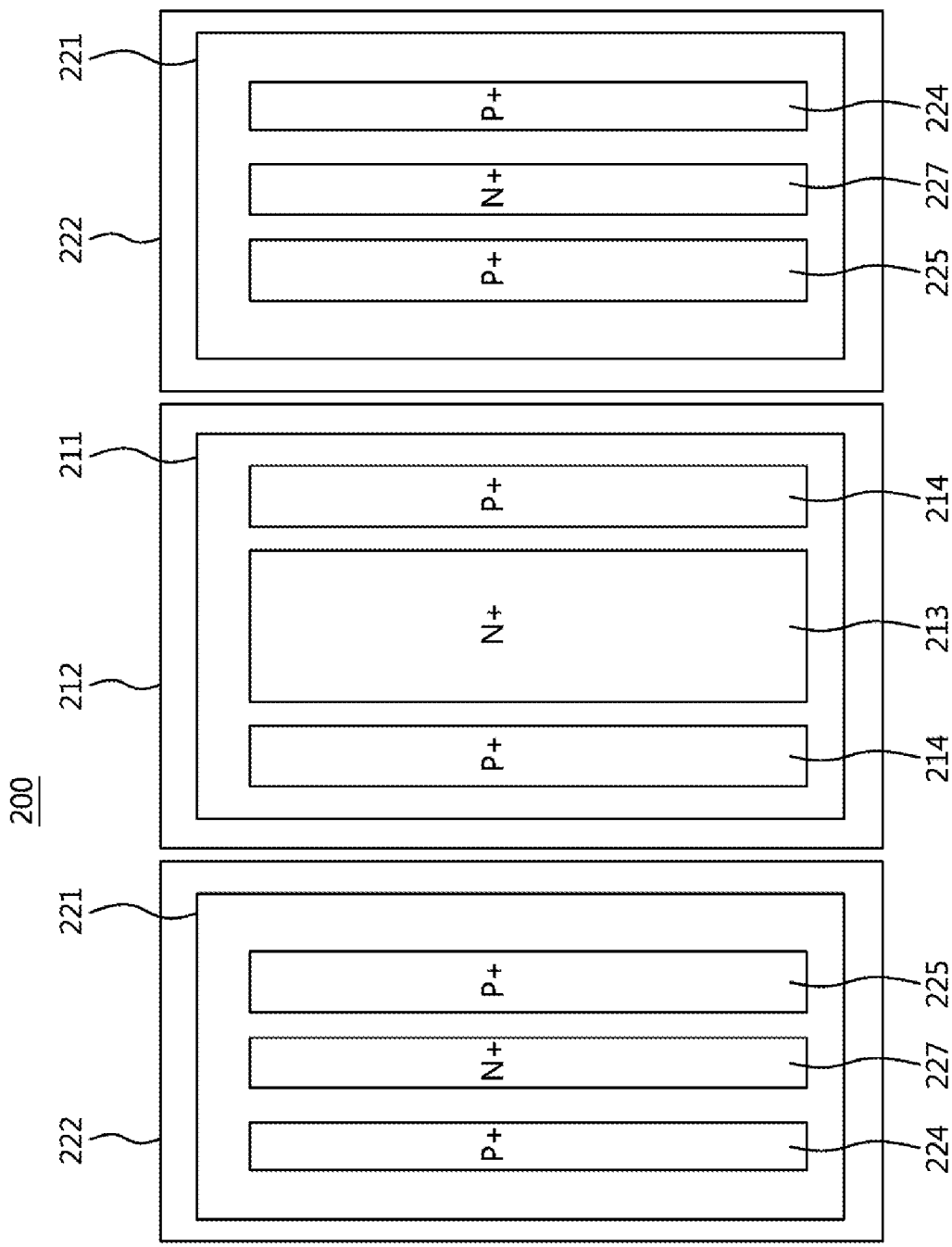
FIG. 4A and FIG. 4B are plan views of an ESD protection device based on a silicon controlled rectifier according to another one or more embodiments of the disclosure.
Figure 4B:
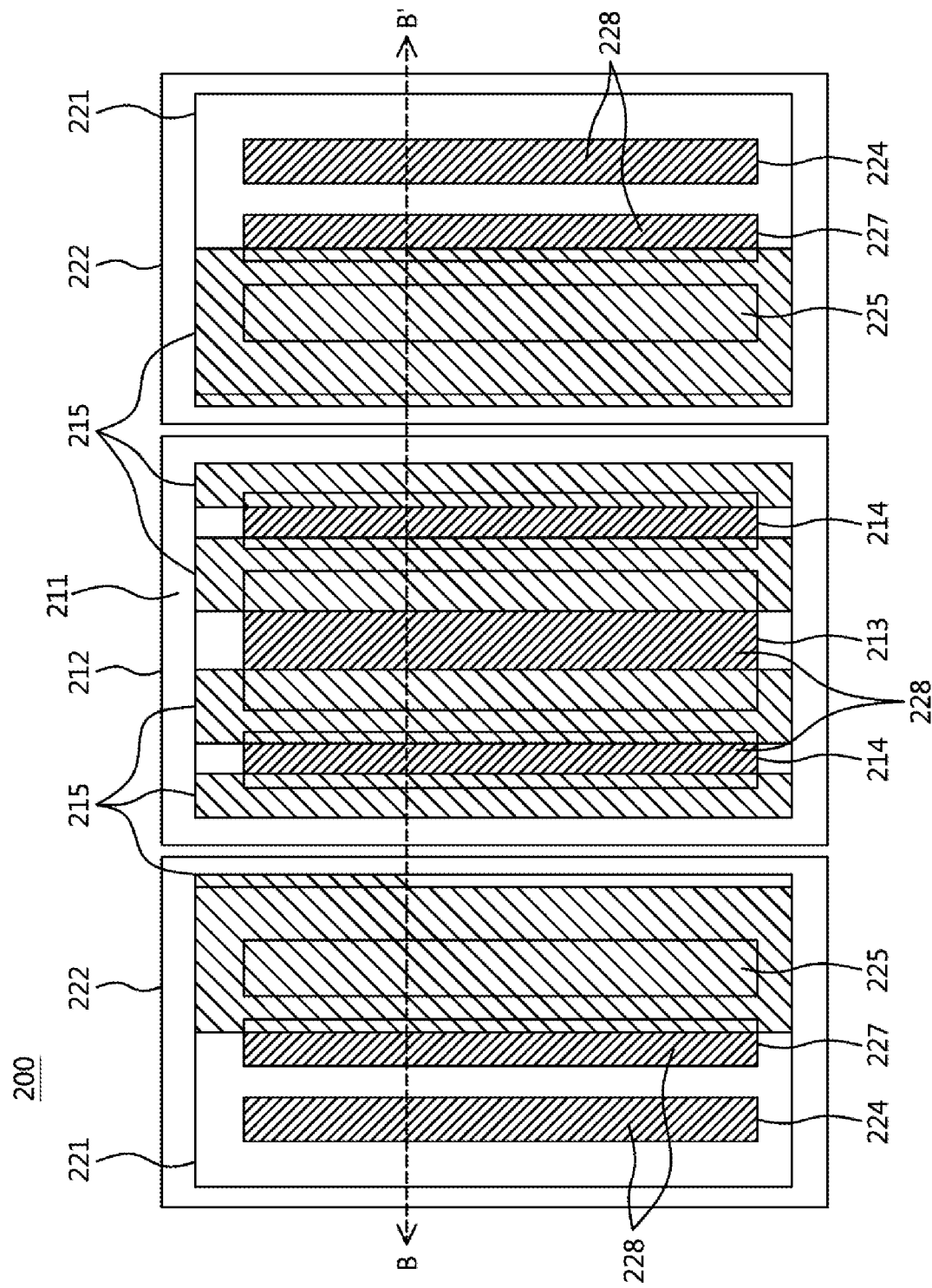

FIG. 4A and FIG. 4B are plan views of an ESD protection device based on a silicon controlled rectifier according to another one or more embodiments of the disclosure.

With reference to FIG. 4A, an N-type drift region 211 and a P-type body region 221 may be further included in the explained ESD protection device 200. Herein, other composition elements except for an N-type drift region of 211 and a P-type body region 221 are the same as the explained ESD protection device 200. Therefore, a detailed description is abridged.

An N-type drift region 211 and a P-type body region 221 raises a holding voltage to resist Latch-up. An N-type drift region 211 and an N-type well 212 are formed to be overlapped, wherein the N-type drift region 211 is disposed below the N-type well 212. Also, a P-type body region 221 and a P-type well 222 are formed to be overlapped, wherein the P-type body region 221 is disposed below the P-type well 222.

With reference to FIG. 4B, the non-sal layer 215 is formed on an N-type well 212. Herein, other composition elements except for an N-type drift region 211 and a P-type body region 221 are the same as the explained ESD protection device 200, and therefore, detailed description is abridged.

As described in FIG. 4B, the non-sal layer 215 covers a part of an N-type drift region 211 and a part of a P-type body region 221. A silicide film 228 is formed in a rest area of an N-type drift region of 211 and a P-type body region 221 that a non-sal layer may not cover.

Figure 5:
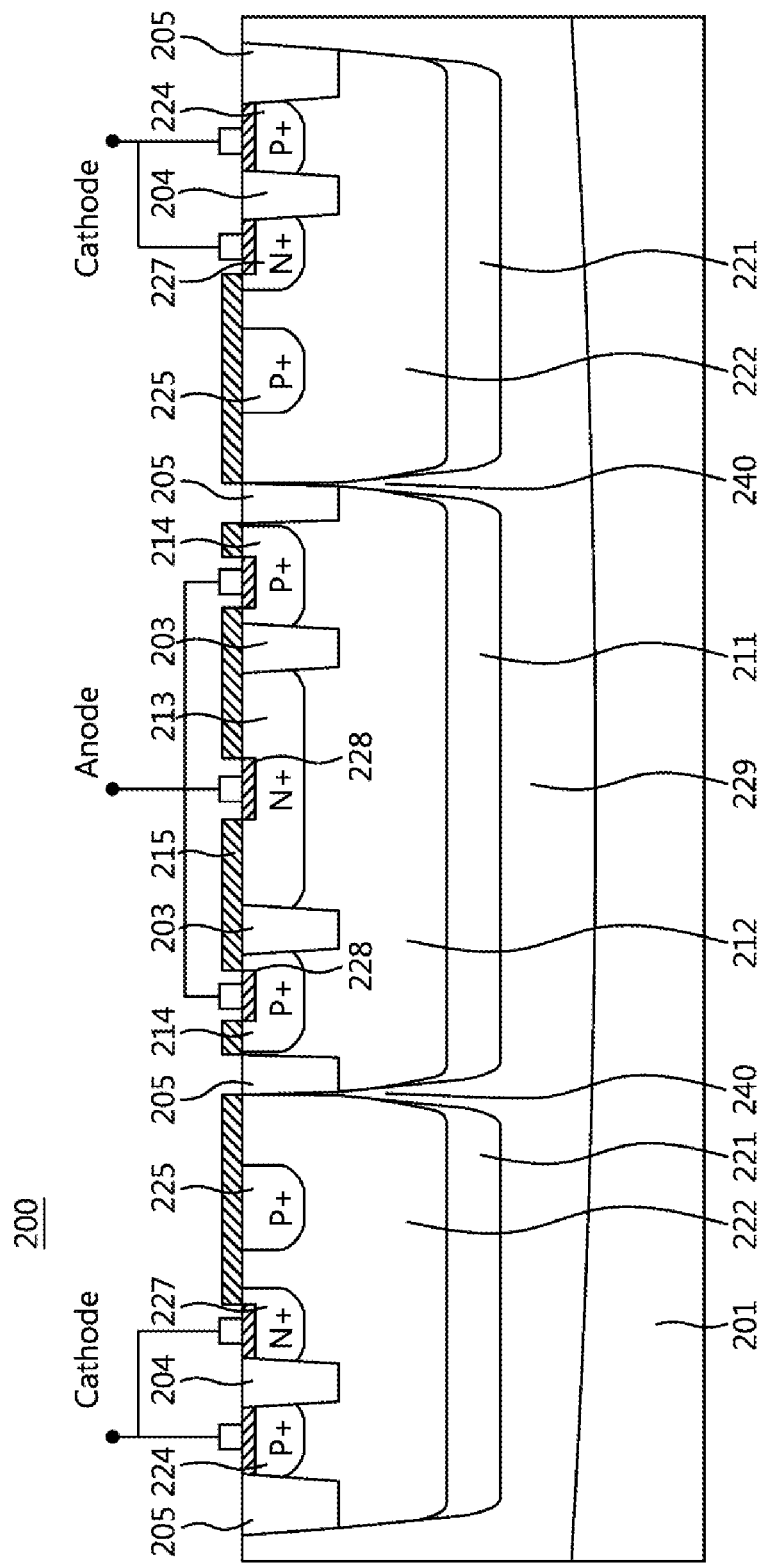
FIG. 5 is a cross-sectional view of B-B' of FIG. 4B a section of an ESD protection device based on a silicon controlled rectifier according to another one or more embodiments of the disclosure.

FIG. 5 is a cross-sectional view of B-B' of FIG. 4B, a section of an ESD protection device based on a silicon controlled rectifier, according to another one or more embodiments of the disclosure.

With reference to FIG. 5, an N-type drift region of 211 and a P-type body region 221 may be further included in the explained ESD protection device 200. Although other composition elements, except for an N-type drift region 211 and a P-type body region 221, are the same as the explained ESD protection device 200, a detailed description is abridged.

An N-type drift region 211 and a P-type body region 221 raises a holding voltage to resist Latch-up.

An N-type well 212 is formed in an N-type drift region 211. An N-type drift region may be doped with a lower concentration than an N-type well 212. An effect of increasing a junction area may be achieved through that.

By forming an N-type well 212 in an N-type drift region 211, a base concentration of a parasitic PNP bipolar transistor increases, and a holding voltage rises as a current gain of a parasitic PNP bipolar transistor decreases.

Moreover, a P-type well 222 is formed in a P-type body region 221. A P-type body region 221 may be doped with a lower concentration than a P-type well 222. An effect of increasing a junction area may be achieved through that.

By forming a P-type well 222 in a P-type body region 221, a parasitic NPN bipolar transistor's base concentration increases, and a holding voltage rises as a current gain of a parasitic NPN bipolar transistor decreases.

As an ESD current increases, a voltage flows into an Anode terminal, a junction between an N-type drift region 211 and a P-type body region 221 becomes reverse biased. Herein, a junction between an N-type drift region 211 and a P-type body region 221 is executed in the space 240 between an N-type drift region 211 and a P-type body region 221.

When an electric field of a junction between an N-type drift region 211 and a P-type body region 221, which is in a state of reverse bias, reaches a threshold value that creates Avalanche breakdown, an EHP (Electron-Hole Pair) is created by avalanche breakdown. Hence, through an N-type drift region 211 and a P-type body region 221, a junction area of two P-type wells 222 and an N-type well 212 may be widened.

A created hole current may move to a P-type body region 221 and raise the potential of a P-type body region 221. With a junction of a second N-type diffusion region 227 connected with a Cathode, when an increased potential of a P-type body region 221 is higher than 0.7V, which is a Built-in Potential, a parasitic NPN bipolar transistor may turn on.

A current of a turned-on parasitic NPN bipolar transistor may form a drop of voltage in an N-type drift region 211, and a parasitic PNP bipolar transistor may turn on. A turned-on parasitic PNP bipolar transistor may form a drop of voltage in a P-type body region 221, and, by making a parasitic NPN bipolar transistor turned-on, an ESD protection device may be triggered, and that voltage may become a trigger voltage.

When an ESD protection device is triggered, an anode voltage may be diminished to a minimum value and become a holding voltage because there is no need to provide a bias to a parasitic NPN bipolar transistor by a current of a parasitic PNP bipolar transistor. Moreover, with a Positive Feedback of an ESD protection device, an ESD current flowed into an Anode terminal may be effectively discharged.

Figure 6:
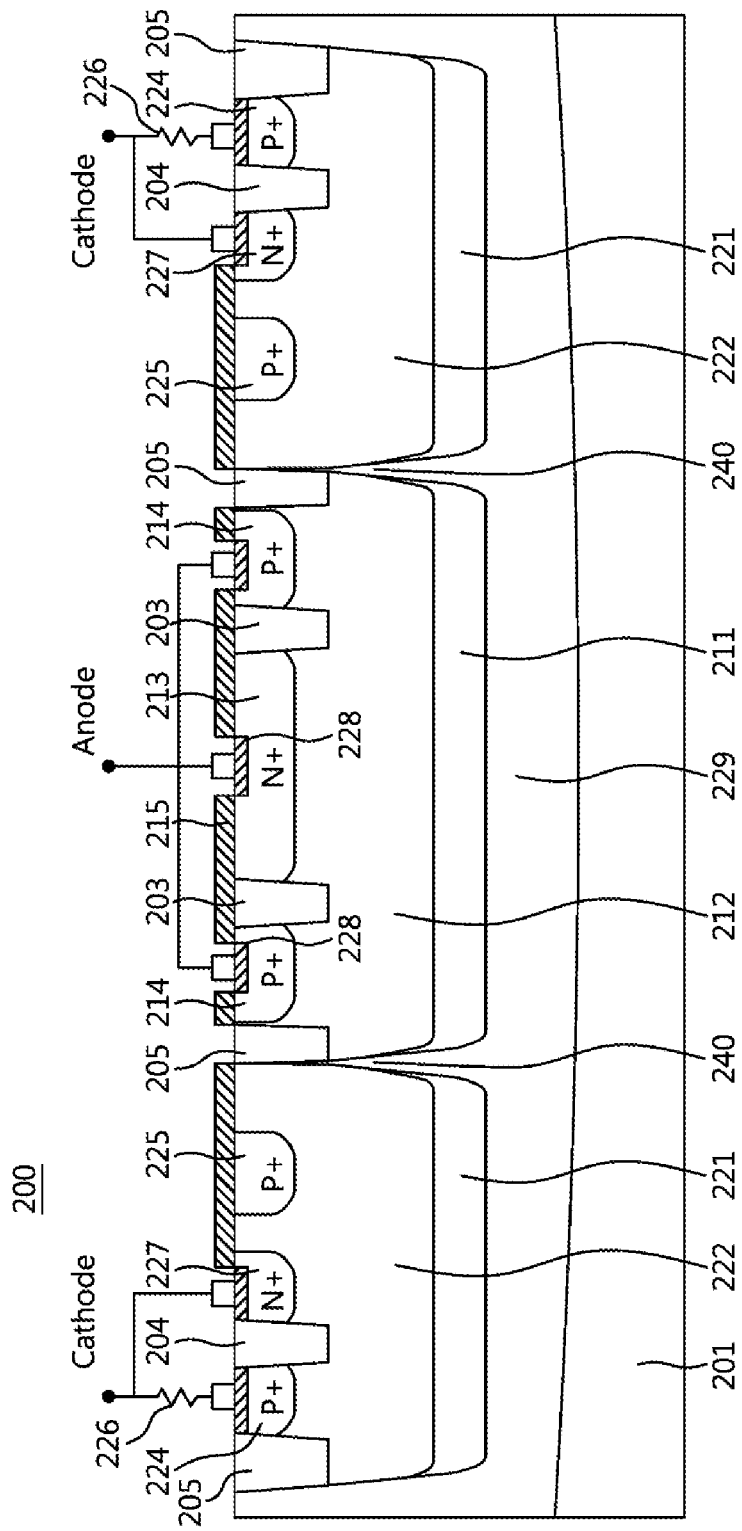
FIG. 6 is a cross-sectional view of an ESD protection device based on a silicon controlled rectifier according to another one or more embodiments of the disclosure.

FIG. 6 is a cross-sectional view of an ESD protection device based on a silicon controlled rectifier according to another one or more embodiments of the disclosure.

With reference to FIG. 6, a resistor 226 may be further included in the explained ESD protection device 200, connected in a second P-type diffusion region 224. Herein, other composition elements except for a resistor 226 are the same as the explained ESD protection device 200; a detailed description is abridged.

A resistor 226 is connected in a second P-type diffusion region 224 and diminishes a trigger voltage. For example, the resistor may be an updoped Poly-Si resistor that has a high resistance. Thus, a resistor 226 may be formed as a poly-silicon form.

By connecting a resistor 226 in a second P-type diffusion region 224, a hole may be formed by Avalanche breakdown in a separation space 240 of an N-type well 212 and two P-type wells 222. To prevent the hole from leaking to a second P-type diffusion region 224, the concentration of a hole in two P-type wells 222 may be increased, and Built-in Potential 0.7V may be rapidly induced in a junction of a second N-type diffusion region 227 connected with a Cathode. Through that, a turn-on of a diode may be more rapidly created.

Figure 7:
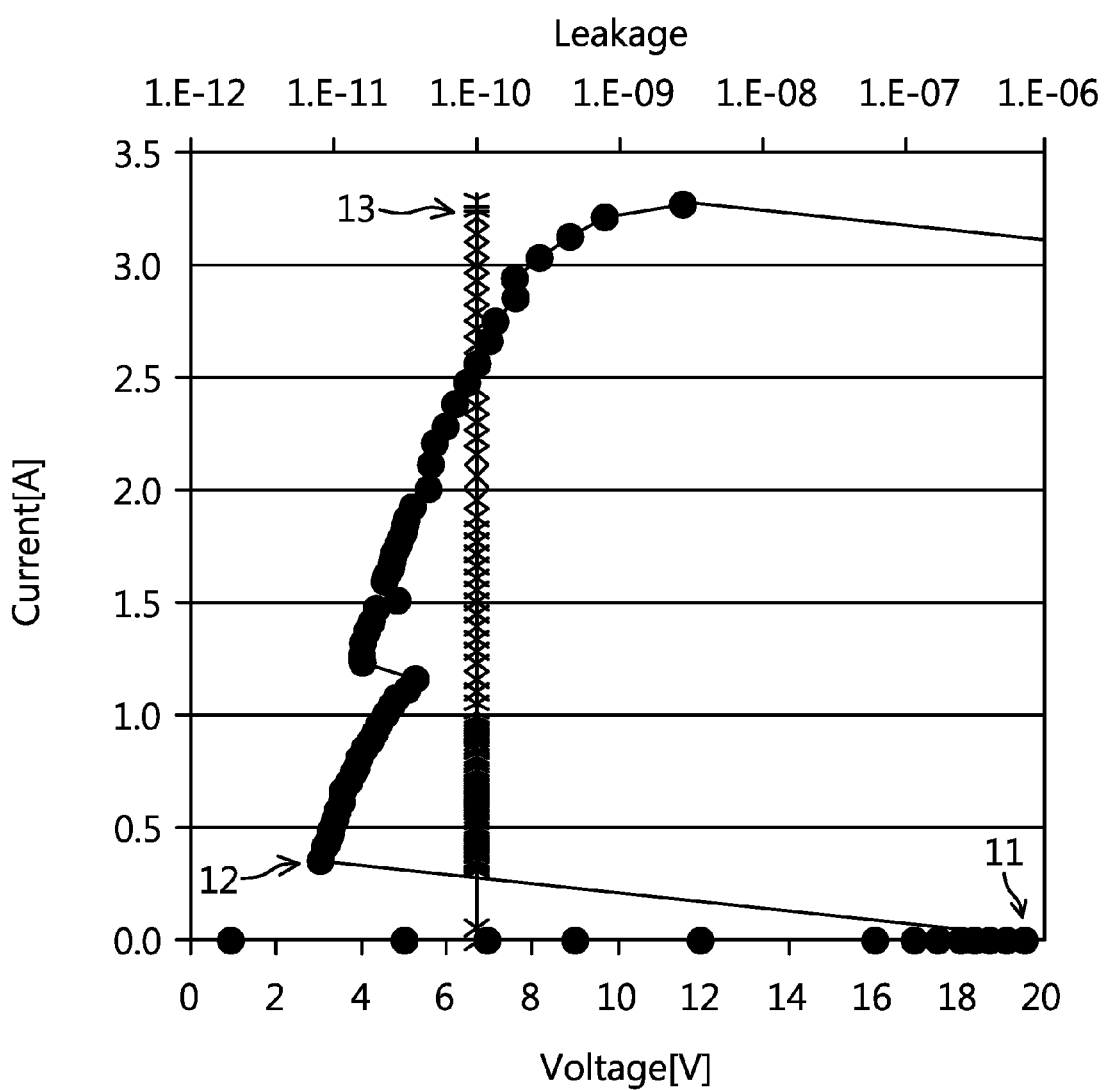
FIG. 7 is a graph illustrating a feature of the current-voltage of an ESD protection device based on a normal silicon controlled rectifier.

FIG. 7 is a graph illustrating a feature of the current-voltage of an ESD protection device based on a normal silicon controlled rectifier.

With reference to FIG. 7, when an ESD surge flows into an SCR, like FIG. 1, static electricity may be discharged by earthing. An SCR remains off state until reaching a trigger point 11, and when it rises above a trigger voltage 11, a feature moves, following a curve of a holding voltage 12. When an SCR feature moves following a curve of a holding voltage 12, an ESD current path may be formed.

As described in FIG. 7, it can be seen that a trigger voltage of an SCR is considerably high at 20V, and a holding voltage is relatively low at 3V.

Figure 8:
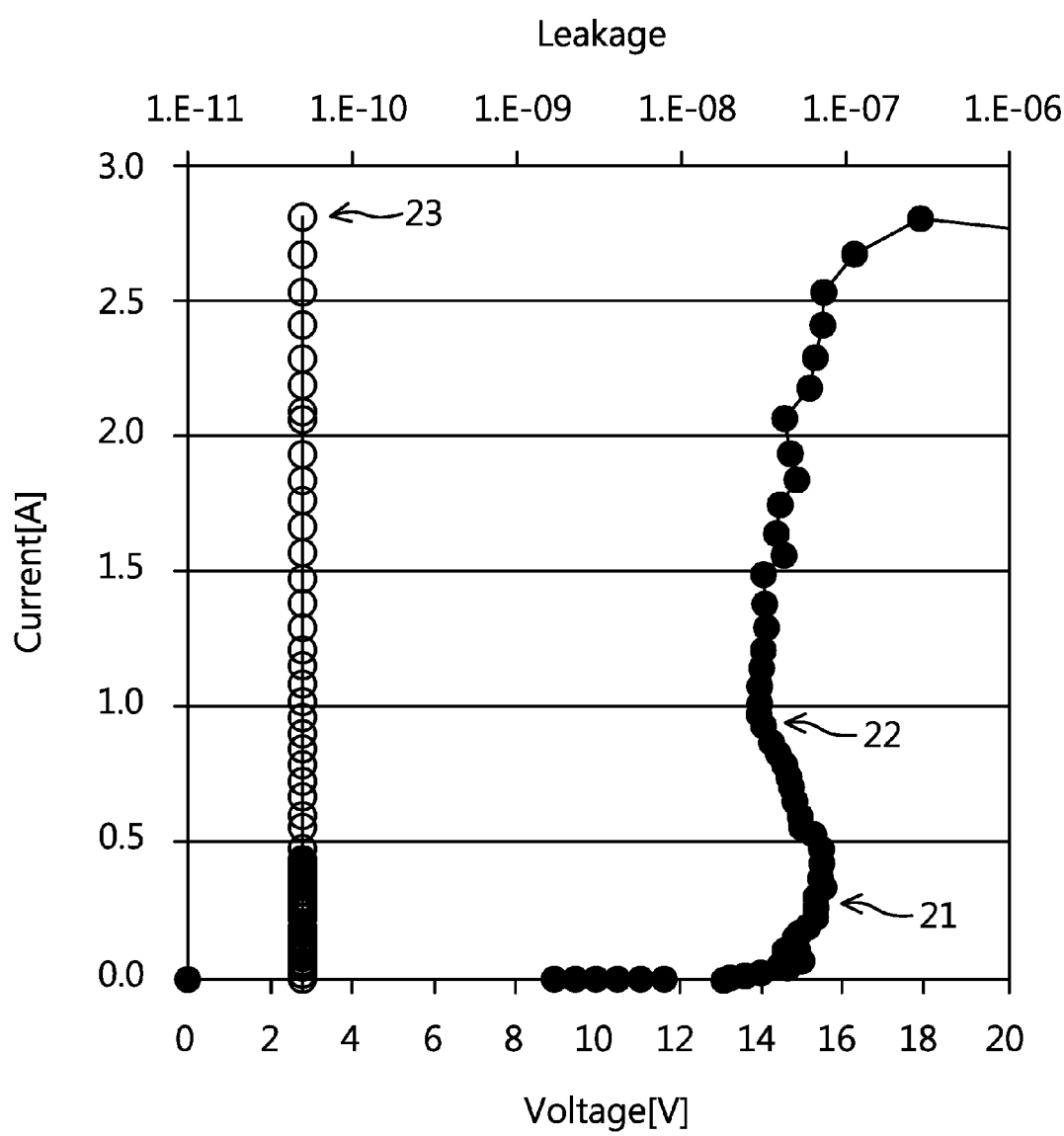
FIG. 8 is a graph illustrating a feature of the current-voltage of an ESD protection device based on a silicon controlled rectifier according to one or more embodiments of the disclosure.

FIG. 8 a graph illustrating a feature of current-voltage of an ESD protection device based on a silicon controlled rectifier according to one or more embodiments of the disclosure.

With reference to FIG. 8, in an ESD protection device based on silicon controlled rectifier like FIG. 2 or FIG. 6, a parasitic NPN bipolar transistor turns on, a voltage is dropped by N-type drift region, and a parasitic PNP bipolar transistor turns on. Thus, a turned-on parasitic PNP bipolar transistor makes a voltage dropped in P-type body region and a parasitic NPN bipolar transistor turned-on, which may decrease the trigger voltage from 21 to 16V.

Moreover, because there is no need to provide a bias to a parasitic NPN bipolar transistor by a current of a parasitic PNP bipolar transistor, an anode voltage may be diminished to a minimum value, and a holding voltage 22 may be increased up to 15V.

As explained above, by forming an N-type drift region 211 and a P-type body region 221 in an N-type well 212 and two P-type wells 222, respectively, and by having a high current capacity, a holding voltage may be increased. Resistance is added between a Cathode, a P-type body region 221, and a second P-type diffusion region 224 included in two P-type wells 222, and through that, a trigger voltage is diminished.

An N-type drift region 211 and a P-type body region 221 may be doped with a lower concentration than an N-type well 212 and two P-type wells 222, and a holding voltage of an ESD protection device based on silicon controlled rectifier is increased. An N-type drift region 211 may increase the base concentration of a parasitic PNP bipolar transistor, which diminishes the current gain of a parasitic PNP transistor. A P-type body region 221 may increase a base concentration of parasitic NPN bipolar transistor, which diminishes the current gain of a parasitic NPN transistor. Herein, an N-type drift region 211 and a P-type body region 221 may be formed separately.

According to the disclosure, it is possible to enhance the current capacity of an ESD protection device based on silicon controlled rectifier that increases a holding voltage and decreases a trigger voltage to be resistant to Latch-up.

With that, an excellent current capacity may be gained, which is better than that of the formerly used ESD protection device, and productivity may be enhanced by diminishing a device's size.

As explained, an ESD protection device of the subject disclosure based on silicon controlled rectifier may ensure the device's reliability and stability by increasing a holding voltage and inducing a low trigger voltage. Moreover, as the current capacity is increased, a micronization of a device size may be possible.

While this disclosure includes specific examples, it will be apparent after an understanding of the disclosure of this application that various varies in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An ESD protection device, comprising;
   an N-type well formed in a semiconductor substrate;
   first and second P-type wells formed on opposite sides of the N-type well;
   a first N-type diffusion region formed in the N-type well;
   first and second P-type diffusion regions, each formed on opposite sides of the first N-type diffusion region in the N-type well;
   a second N-type diffusion region and a third P-type diffusion region formed in each of the first and second P-type wells;
   a P-type floating region formed in each of the first and second P-type wells,
   wherein a width of the first N-type diffusion region is formed wider than a width of the second N-type regions;
   a third separation film disposed between the N-type well and each of the first and second P-type wells, the third separation film being insulative; and
   a single continuous non-sal layer disposed on each of the first and second P-type wells from the third separation film to the second N-type diffusion region and covering the respective P-type floating regions,
   wherein each of the P-type floating regions is disposed spaced apart from its respective third separation film.

2. The ESD protection device of claim 1, further comprising
   a silicide film formed on the first N-type diffusion region;
   a single continuous second non-sal layer disposed from the silicide film to the first P-type diffusion region and covering one portion of the first N-type diffusion region; and
   a single continuous third non-sal layer from the silicide film to the second P-type diffusion region and covering another portion of the first N-type diffusion region.

3. The ESD protection device of claim 1,
   wherein the first N-type diffusion region and the first and second P-type diffusion regions, connected with an Anode terminal, are separated by first separation films.

4. The ESD protection device of claim 1,
   wherein the second N-type diffusion region and the third P-type diffusion region, connected with a respective Cathode terminal, are separated by a respective second separation film.

5. The ESD protection device of claim 1, further comprising;
   a deep P-type well in the substrate; and
   an N-type drift region, a first P-type body region and a second P-type body region formed in the deep P-type well,
   wherein the N-type well overlaps the N-type drift region, and
   wherein the first and second P-type wells overlap the first and second P-type body regions, respectively.

6. The ESD protection device of claim 1, further comprising:
   a resistor connected in the third P-type diffusion region, wherein the resistor is formed of poly-silicon.

* * * * *